United States Patent [19]
Floyd et al.

[11] Patent Number: 5,884,772
[45] Date of Patent: Mar. 23, 1999

[54] ELECTRONIC DEVICE HAVING MULTIPLE USER INTERFACE CONFIGURATIONS

[75] Inventors: Michael Richard Floyd, Palm Beach Gardens, Fla.; Rebecca Lynn Parsons, Dunwoody, Ga.

[73] Assignee: Motorola, Inc., Schaumburg, Ill.

[21] Appl. No.: 923,251

[22] Filed: Sep. 4, 1997

[51] Int. Cl.$^6$ .................................................. B65D 85/86
[52] U.S. Cl. ................. 206/701; 206/305; 220/4.02; 455/90; 455/349; 73/431; 174/66; 361/681; 361/728; 361/809
[58] Field of Search .............................. 206/305, 316.1, 206/320, 576, 701, 722, 724; 220/4.02; 248/27.1, 27.3; 312/7.1, 7.2, 223.1, 223.2; 379/428, 439, 440, 441, 451, 452; 455/90, 348, 349, 351; 174/66, 67; 73/431; 439/910; 361/600, 679, 680, 681, 683, 728, 752, 753, 807, 809, 814

[56] References Cited

U.S. PATENT DOCUMENTS

D. 389,148  1/1998  Floyd et al. ........................... D14/191
4,199,204   4/1980  Hodsdon et al. ....................... 312/7.1
4,920,799   5/1990  Low ..................................... 73/431
5,427,537   6/1995  Savovic et al. ......................... 439/77

*Primary Examiner*—Leo P. Picard
*Assistant Examiner*—John B. Vigushin
*Attorney, Agent, or Firm*—James A. Lamb

[57] ABSTRACT

A portable electronic device (100) includes a housing cover (110) having a faceplate location (145), an electronic circuit (115), and a first faceplate (140). The location comprises a generic controls cutout (135) and a generic display cutout (130). The electronic circuit includes a specific set of controls (125) fitting within the generic controls cutout and a specific display (120) fitting within the generic display cutout. The first faceplate (140) is mounted in the faceplate and has a specific controls cutout (155) that is conformal to the set of specific controls (125) and a specific display lens (150) that is conformal to the specific display (120) and is one of a set of faceplates, wherein the first faceplate (140) is incompatible with another faceplate in the set of faceplates.

4 Claims, 3 Drawing Sheets

//=== PAGE START ===//

ELECTRONIC DEVICE HAVING MULTIPLE USER INTERFACE CONFIGURATIONS

RELATED APPLICATIONS

U.S. Design Pat. No. D389,148, issued to Floyd et al. on Jan. 13, 1998, entitled "PAGER".

FIELD OF THE INVENTION

This invention relates in general to configuring the user interface (display and controls) of an electronic device, and in particular to modification of the housing of an electronic device to accommodate physically incompatible versions of the user interface.

BACKGROUND OF THE INVENTION

Today, many electronic devices include both a display and controls. In many of these devices, environmental sealing is provided to prevent damage to the device when exposed to a wet environment, such as a water splash or brief exposure to rain. In portable electronic devices such as pagers and compact disk players, there is typically a liquid crystal display and several buttons. To improve customer appeal, portable devices (such as some pagers) having a common housing shape and significant common electronics are altered by, for example, changing the size of a display, the shape or number of controls, or legends identifying functions of button controls or legends providing the meaning of display icons that are only distinguished by position on the display. Such alterations provide multiple user interface configurations that are desirable for marketing reasons. This can be particularly important in a global marketplace where cultural differences emphasize a need for differently shaped buttons, and in differing markets within a country wherein the same electronics are used but different functions are provided by different programming instructions.

Techniques commonly employed to provide such differences are adhesive attached labels having different legends for a given display and set of buttons, or a changed housing cover to accommodate differing quantities or shapes of buttons that have legends on them. The use of an adhesive attached label having different legends works well with a fixed arrangement of display and unlegended buttons, but what is needed is a technique to accommodate differing sizes, shapes and locations of buttons and displays that avoids expensive and lengthy housing tooling changes, and provides for easy repair and yet maintains the water resistance integrity desired for the market.

DETAILED DESCRIPTION OF THE DRAWINGS

Figure 1:
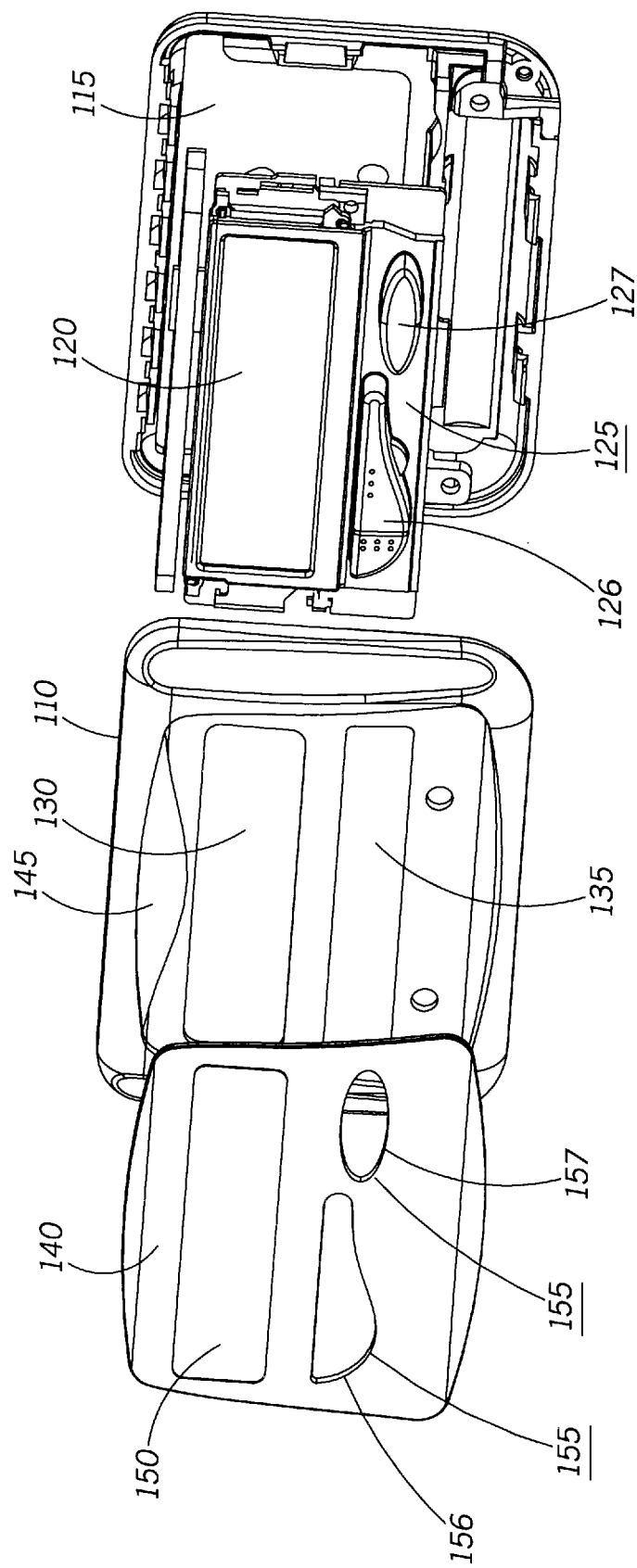
FIG. 1 shows an exploded view drawing of a first pager, in accordance with the preferred embodiment of the present invention.

Referring to FIG. 1, an exploded view drawing of a first pager 100 is shown, in accordance with the preferred embodiment of the present invention. The first pager 100 comprises a housing that comprises a housing cover 110 (otherwise called a front housing). The housing and housing cover 110 are preferably manufactured by a plastic injection molding technique. Inside the housing is a first electronic circuit 115 that comprises a first display 120 and first specific controls 125. The first display 120 is mounted within a generic display area of the electronic circuit 115 such that graphics presented on the first display 120 fall within a generic display cutout 130 of the housing cover 110. In other words, the first display 120 fits within the generic display cutout 130. The generic display area is such as to allow the graphics of any display mounted therein to be visible within the generic display cutout 130 of the housing cover 110. The first specific controls 125, which are two push buttons 126, 127 in this example, are mounted to the first electronic circuit 115 in a generic controls area of the first electronic circuit 115 which matches a generic controls cutout 135 of the housing cover 110 so as to allow the two push buttons 126, 127 to protrude through the generic controls cutout 135. A first faceplate 140 mounts in a recess 145 within the housing cover 110. The first faceplate 140 is a preferably plastic piece of uniform thickness that has an outline shape that matches the shape of the recess 145, and is slightly curved to match a crown shape of the housing cover 110. The faceplate comprises a first specific display lens 150 and a first specific controls cutout 155. The plastic of the first faceplate 140 is preferably a transparent plastic with an opaque coating on the side of the plastic lens that abuts the housing cover 110. The opaque coating coats the plastic but for the first specific display lens 150. Legends on the first faceplate 140, such as the manufacturer's logo and function icons or names for unlabeled buttons, are preferably painted on the first faceplate 140 prior to the application of the coating. The first specific controls cutout 155 comprises two holes 156, 157.

The first specific display lens 150 is conformal to the first display 120, which as used herein means that the shape of the first specific display lens 150 conforms to the shape of the graphics that are visible on the first display 120 and prevents undesired viewing of distracting features such as an edge of the first display 120. The first specific controls cutout 155 is conformal to the first specific controls 125. As used herein, a specific controls cutout (in this case, the first specific controls cutout 155) conformal to a specific set of controls (in this case, the first specific controls 125) means that each hole (in this case, holes 156, 157) of which the specific controls cutout is comprised is larger than the control (in this case, one of the two push buttons 126, 127) which passes through the hole only enough to provide non-binding use of the control under all conditions of normal use. By the positioning of the first specific display 120, the generic display cutout 130, and the first specific display lens 150 described above, it will be appreciated that the first specific display lens 150 is within a window of the generic display cutout 130. Similarly, by the positioning of the first specific set of controls 125, the generic controls cutout 135, and the first specific controls cutout 155 described above, it will be appreciated that the first specific controls cutout 155 is within a window of the generic controls cutout 135. It will be further appreciated that two or more controls can occupy one hole when the two controls are close together, while the benefits of the invention described herein are still provided. It will be further appreciated that a model can be provided having no display, in which case the specific display is no display, and that the specific set of controls can be as few as no buttons. It will be further appreciated that the use of a single faceplate instead of, for example, a separate display faceplate and controls faceplate, reduces production labor and parts costs, reduces an inventory of parts in the field and factory, and makes the product more attractive (by avoiding misalignments and additional edges).

Figure 2:
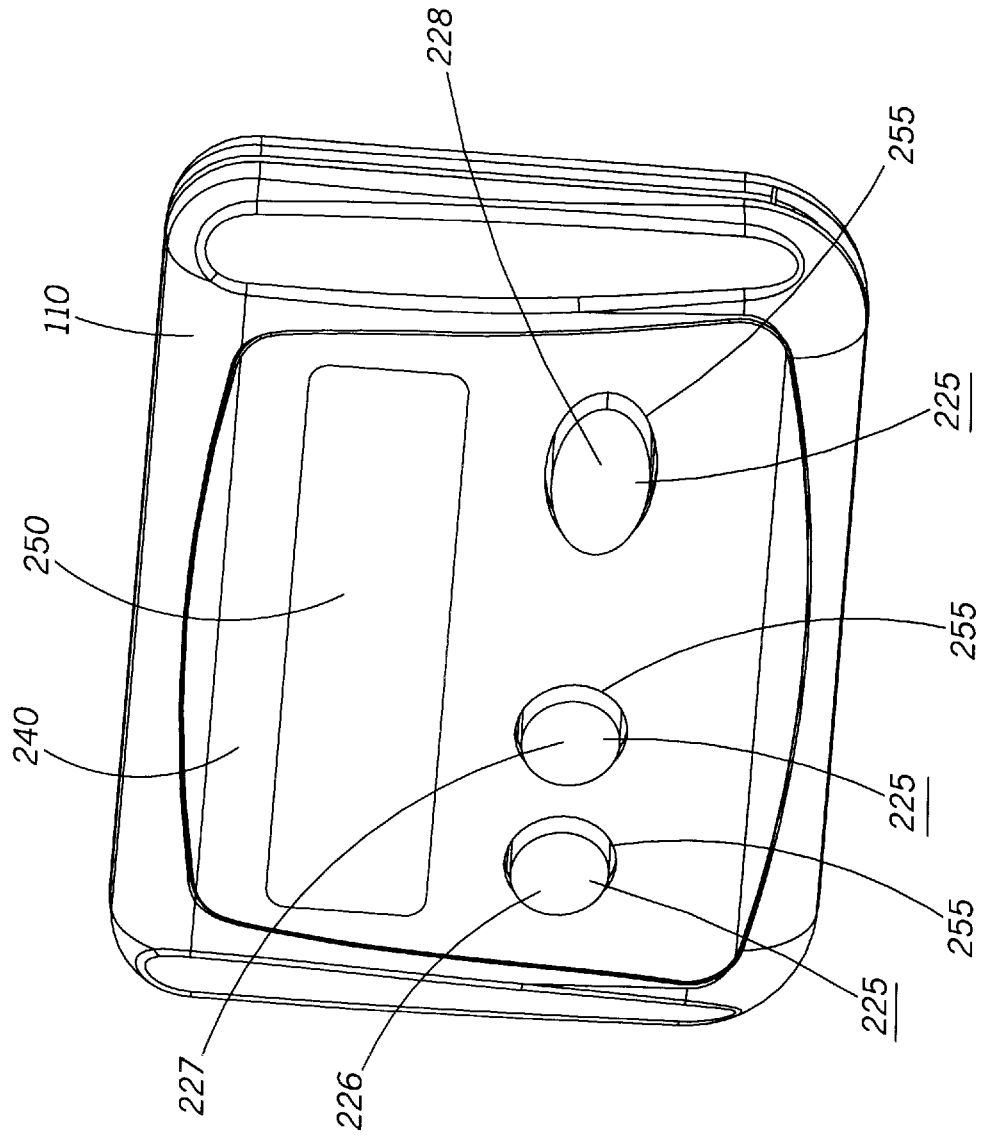
FIG. 2 shows a perspective view from the front of a second pager, in accordance with the preferred embodiment of the present invention.

Referring to FIG. 2, a perspective view from the front of a second pager 200 is shown, in accordance with the preferred embodiment of the present invention. The second pager 200 comprises the same housing, including the housing cover 110 described with reference to FIG. 1. The second pager 200 further comprises a second electronic circuit having the first display 120 and a second specific set of controls 225, comprising three buttons 226, 227, 228. The first display 120 is mounted in a location on the second electronic circuit which is the same relative generic display area as on the first electronic circuit 115. The second specific set of controls 225 are located on the second electronic circuit such that the buttons 226, 227, 228 are within a location on the second electronic circuit which is the same relative generic controls area as on the first electronic circuit 115, and pass through the generic controls cutout 135. The second pager 200 further comprises a second faceplate 240 mounted in the recess 145, that has the same outline shape as the first faceplate 140. The second faceplate 240 comprises a second specific display lens 250 that is located in the second faceplate in the same relative location as the specific display lens 150 of the first faceplate 140. The second faceplate 240 further comprises a second specific controls cutout 255 that is conformal to the second specific set of controls 225.

The first faceplate 140 and the second faceplate 240 are incompatible. As used herein, incompatible when used to describe faceplates means that at least one of two (or more) faceplates which are all made for mounting to the housing cover 110 cannot be used in place of an other of the two (or more) faceplates because at least one control in the set of controls (buttons, in this case) of the other faceplate would not pass through a hole of the one faceplate.

It will be appreciated that the faceplates need not be mounted in a recess of the housing cover; the benefits of the present invention are provided when the faceplate is alternatively mounted to a predetermined faceplate location on the housing cover. It will be further appreciated that by having a generic display cutout and a generic controls cutout in the housing cover 110, pager models having a wide variety of configurations of specific displays and specific sets of controls can be manufactured by using inexpensive tool changes for making faceplates having differing hole configurations and differing lens, while avoiding a substantial amount of time and money required to redesign the housing cover 110 for each model.

Figure 3:
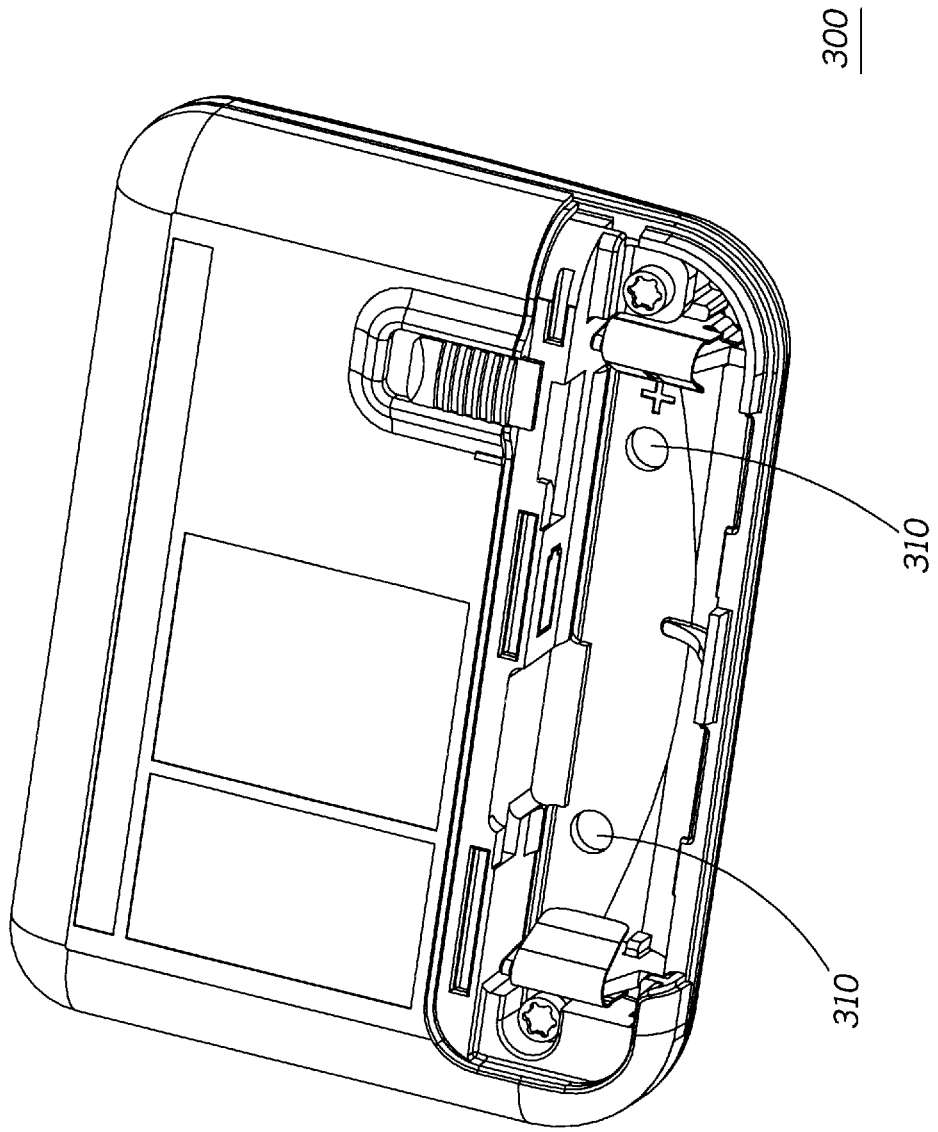
FIG. 3, shows a perspective view from the back of the first pager, in accordance with the preferred embodiment of the present invention.

Referring to FIG. 3, a perspective view from the back of the pager 100 that includes the back is shown, in accordance with the preferred embodiment of the present invention. A battery cover portion (not shown in FIG. 3) of the housing is removed, and no batteries are in the battery compartment 305. Within the battery compartment 305 are two probe holes 310. In accordance with the preferred embodiment of the present invention, the first faceplate 140 is mounted to the housing cover 110 by the use of semi-permanent adhesive, in the form of an adhesive backing on the first faceplate 140. The probe holes allow a probe, such as a small screwdriver, awl, or pen, to be used to press against the back of the first faceplate 140, assisting the removal of the first faceplate 140 without damaging the first faceplate 140, which can otherwise occur when the first faceplate 140 is removed by using a screwdriver or knife around the edge of the recess 145. This feature is distinctly advantageous in the housing according to the present invention, because of the typically larger size of the faceplate 140 in comparison to prior art faceplates or labels for electronic devices of the same size, and because the faceplate 140 may more likely be replaced, such as when the some part of the body of the housing is broken and the faceplate 140 and electronic circuit 115 are transferred to another housing 105. Using the probe holes 310, a person can change the faceplate 140 without having to open the pager 100, thereby exposing the electronics. This is beneficial in a factory for lowering production costs by being able to change faceplates without complete retesting.

It will be appreciated that the improvements obtained by using the technique described herein for producing housings for differing models of pagers is applicable to electronic devices of all types which can have multiple user interfaces in one area, including portable electronic devices such as pagers, and is particularly beneficial for portable electronic devices that have housings produced by costly tools, such as plastic housings made by injection molding or metal housing made by casting.

By now it should be appreciated that there has been provided an electronic device housing that provides a flexible means of changing the specific set of controls and displays, thereby providing multiple user interfaces for different models without having to retool the housing cover of the electronic device.

We claim:

1. A portable electronic device, comprising:
    a housing cover having a faceplate location, wherein the faceplate location comprises a generic controls cutout and a generic display cutout;
    an electronic circuit, mounted within the housing cover, comprising a specific set of controls fitting within the generic controls cutout and a specific display fitting within the generic display cutout; and
    a first faceplate, mounted in the faceplate location of the housing cover, that has a specific controls cutout that is conformal to the set of specific controls and a specific display lens that is conformal to the specific display and is one of a set of faceplates, wherein the first faceplate is incompatible with another faceplate in the set of faceplates.

2. The portable electronic device according to claim 1, wherein the first faceplate further comprises an adhesive backing for semi-permanently mounting the faceplate to the housing cover, and wherein the housing cover further comprises at least one probe hole that is user accessible within a battery compartment for applying a probe to the faceplate, for removal of the faceplate.

3. An electronic device, comprising:
    a housing cover comprising a generic controls cutout and a generic display cutout within a faceplate location; and
    a first faceplate, mounted to the housing cover within the faceplate location, that is one of a set of faceplates, wherein the set of faceplates includes at least two faceplates, and wherein the first faceplate has at least one of a specific controls cutout within a window of the generic controls cutout and a specific display lens within a window of the generic display cutout that is incompatible with cutouts of another faceplate in the set of faceplates.

4. An electronic device, comprising:

a housing cover comprising a generic controls cutout and a generic display cutout within a faceplate location; and a first faceplate, mounted in the faceplate location of the housing cover, that is one of a set of faceplates, wherein the set of faceplates includes at least two faceplates, and wherein the first faceplate has a specific controls cutout within a window of the generic controls cutout that is incompatible with specific controls cutout of another faceplate in the set of faceplates.

* * * * *